(12) United States Patent
Schwefe et al.

(10) Patent No.: US 9,097,065 B2
(45) Date of Patent: Aug. 4, 2015

(54) DRILL BIT DESIGN FOR MITIGATION OF STICK SLIP

(71) Applicant: Baker Hughes Incorporated, Houston, TX (US)

(72) Inventors: Thorsten Schwefe, Spring, TX (US); Hatem Oueslati, Hannover (DE); Leroy W. Ledgerwood, III, Cypress, TX (US); Jayesh R. Jain, The Woodlands, TX (US); Danielle M. Fuselier, Spring, TX (US)

(73) Assignee: BAKER HUGHES INCORPORATED, Houston, TX (US)

( * ) Notice: Subject to any disclaimer, the term of this patent is extended or adjusted under 35 U.S.C. 154(b) by 333 days.

(21) Appl. No.: 13/630,780

(22) Filed: Sep. 28, 2012

(65) Prior Publication Data

US 2013/0081880 A1 Apr. 4, 2013

Related U.S. Application Data

(60) Provisional application No. 61/541,657, filed on Sep. 30, 2011.

(51) Int. Cl.
 - *E21B 10/00* (2006.01)
 - *E21B 10/42* (2006.01)
 - *G06F 17/50* (2006.01)

(52) U.S. Cl.
 CPC ............ *E21B 10/00* (2013.01); *E21B 10/42* (2013.01); *G06F 17/5086* (2013.01)

(58) Field of Classification Search
 CPC ........... E21B 10/00; E21B 10/42; B21K 5/04; G06F 17/50; G06F 17/5086
 USPC ............... 175/327, 331, 338, 342; 76/108.1; 703/1
 See application file for complete search history.

(56) References Cited

U.S. PATENT DOCUMENTS

| | | | |
|---|---|---|---|
| 6,298,930 B1 | 10/2001 | Sinor et al. | |
| 6,460,631 B2 * | 10/2002 | Dykstra et al. | 175/57 |
| 6,659,199 B2 | 12/2003 | Swadi | |
| 6,779,613 B2 | 8/2004 | Dykstra et al. | |
| 6,935,441 B2 | 8/2005 | Dykstra et al. | |
| 2005/0133272 A1 * | 6/2005 | Huang et al. | 175/327 |
| 2010/0276200 A1 | 11/2010 | Schwefe et al. | |

OTHER PUBLICATIONS

Jain et al., Mitigation of Torsional Stick-Slip Vibrations in Oil Well Drilling through PDC Bit Design: Putting Theories to the Test, SPE Annual Technical Conference, SPE146561, Oct. 30, 2011 through Nov. 2, 2011, 13 pages.

* cited by examiner

Primary Examiner — Yong-Suk (Philip) Ro
(74) Attorney, Agent, or Firm — TraskBritt (57) ABSTRACT

A method of designing an earth-boring rotary drill bit includes designing a bit body and cutting elements of the drill bit such that features of the drill bit other than cutting elements engage and rub against a subterranean formation being drilled by the drill bit at depths-of-cut beyond, but close to, an intended median depth-of-cut, and such that the amount of rubbing area between such features and the formation increases at a relatively rapid rate as the depth-of-cut increases beyond the intended median depth-of-cut. Such methods may be employed to mitigate the occurrence of the "stick-slip" phenomenon during drilling. A method of fabricating a drill bit includes configuring a bit body and cutting elements in accordance with such a design. Earth-boring drill bits include a bit body and cutting elements so configured.

8 Claims, 8 Drawing Sheets

DRILL BIT DESIGN FOR MITIGATION OF STICK SLIP

CROSS-REFERENCE TO RELATED APPLICATION

This application claims the benefit of U.S. Provisional Patent Application Ser. No. 61/541,657, filed Sep. 30, 2011, the disclosure of which is hereby incorporated herein in its entirety by this reference.

TECHNICAL FIELD

Embodiments of the present disclosure relate generally to fixed-cutter earth-boring rotary drill bits, and to methods of designing, making, and using such fixed-cutter earth-boring rotary drill bits.

BACKGROUND

Earth-boring tools for forming wellbores in subterranean earth formations may include a plurality of cutting elements secured to a body. For example, fixed-cutter earth-boring rotary drill bits (also referred to as "drag bits") include a plurality of cutting elements that are fixedly attached to a bit body of the drill bit.

The cutting elements used in such earth-boring tools often include polycrystalline diamond compact cutters (often referred to as "PDCs"), which are cutting elements that include a polycrystalline diamond (PCD) material. Such polycrystalline diamond cutting elements are formed by sintering and bonding together relatively small diamond grains or crystals under conditions of high temperature and high pressure in the presence of a catalyst (such as, for example, cobalt, iron, nickel, or alloys and mixtures thereof) to form a layer of polycrystalline diamond material on a cutting element substrate. These processes are often referred to as high temperature/high pressure (or "HTHP") processes.

Figure 1:
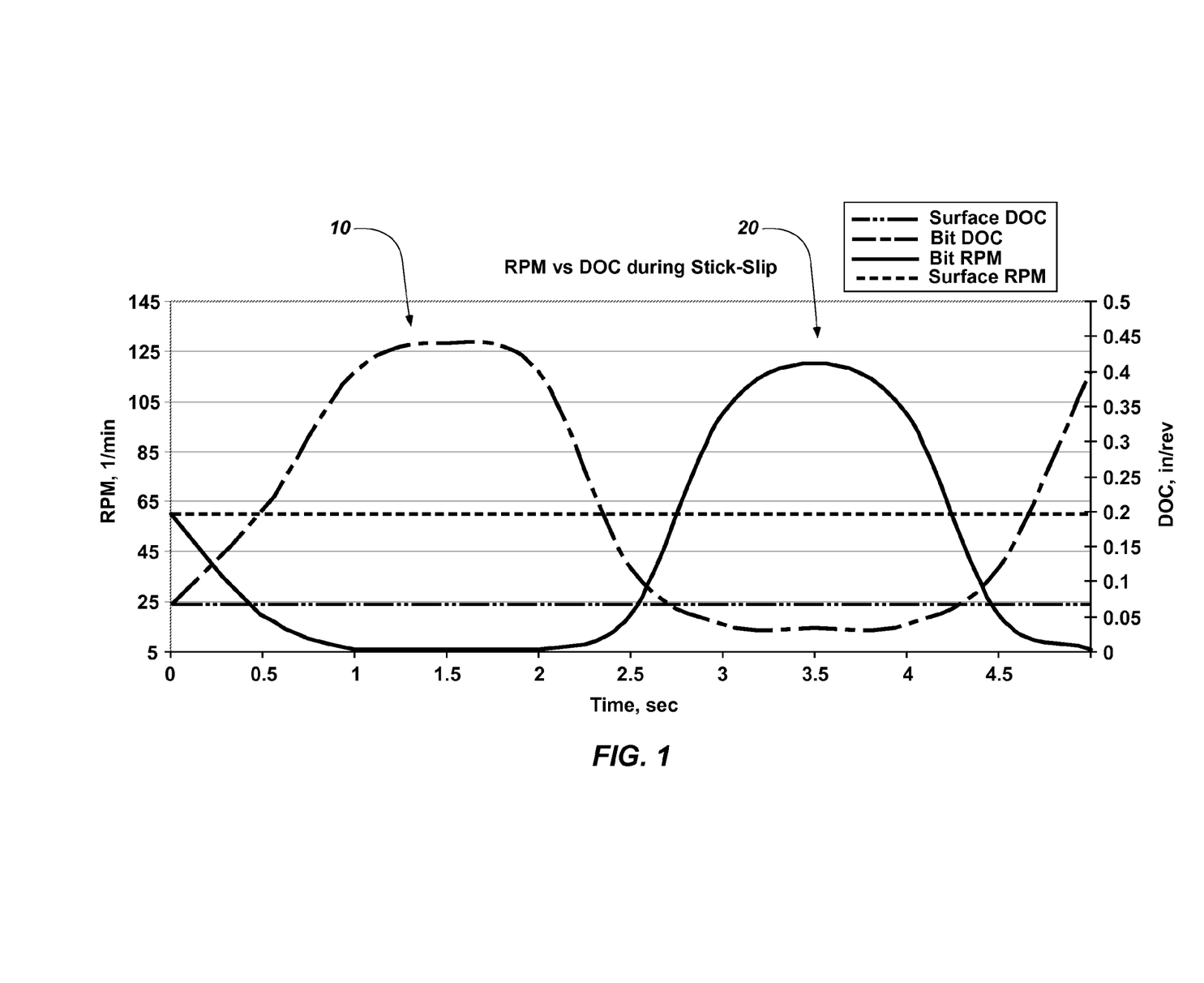
FIG. 1 is a graph representing the oscillations in revolutions per minute (RPM) and depth-of-cut (DOC) of a drill bit during drilling when the drill bit is exhibiting the stick-slip phenomenon.

During drilling, fixed-cutter drill bits sometimes momentarily stick at the bottom of the wellbore, which results in rapidly increasing torque on the bit. Once the torque on the bit reaches a threshold level, the bit will slip back into rotation resulting in a decrease in the torque on the bit. The bit can oscillate between such sticking and slipping at a relatively high frequency, and such oscillation may be manifested in the form of vibrations in the drill string. This phenomenon is known in the art as "stick-slip." FIG. 1 is a graph of RPM and depth-of-cut (DOC) (expressed in terms of inches advanced into the formation per revolution of the drill string) of a drill string at both the drill bit and at the surface of the formation, as a function of time over a five second interval. As shown in FIG. 1, in the "stick" phase (shown generally at reference numeral 10), the DOC of the drill bit increases and the RPM decreases. In the "slip" phase (shown generally at reference numeral 20), the RPM of the drill bit increases, and the DOC decreases. The RPM and DOC at the surface may remain substantially stable while the drill bit is experiencing stick-slip, also as shown in FIG. 1.

Stick-slip vibrations of drill strings have been studied by researchers for several decades. The subject is gaining renewed interest as operating parameters for PDC bits have shifted to the stick-slip regime of higher bit weight and lower rotary speed for enhanced drilling performance. Stick-slip has been identified in the art as a primary cause of bit damage. Various theories for mitigating stick-slip have been set forth in the art. Although the phenomenological basis of these theories has been provided, validation in most cases is based on anecdotal evidence from the field. Data with diagnosis based on down-hole measurements in a controlled environment has been relatively limited. Consequently, conflicting opinions continue to exist about the validity of the various theories set forth in the art for mitigation of stick-slip.

Drilling vibrations have been actively pursued by researchers for a long time as they can result in the failure of bits and BHA components and lead to increased drilling costs due to non-productive time (NPT) and reduced efficiency. For the past two decades, much of the attention in the art to reduction of drill string vibrations has been given to combating backward whirl through anti-whirl bit designs. Meanwhile, cutter technology has progressed dramatically with much more impact and abrasion-resistant, thermally stable PDC cutters. Consequently, the operating parameters for PDC bits have gradually shifted to higher weight on bit (WOB) and lower rotary speed for enhanced drilling performance.

Figure 2:
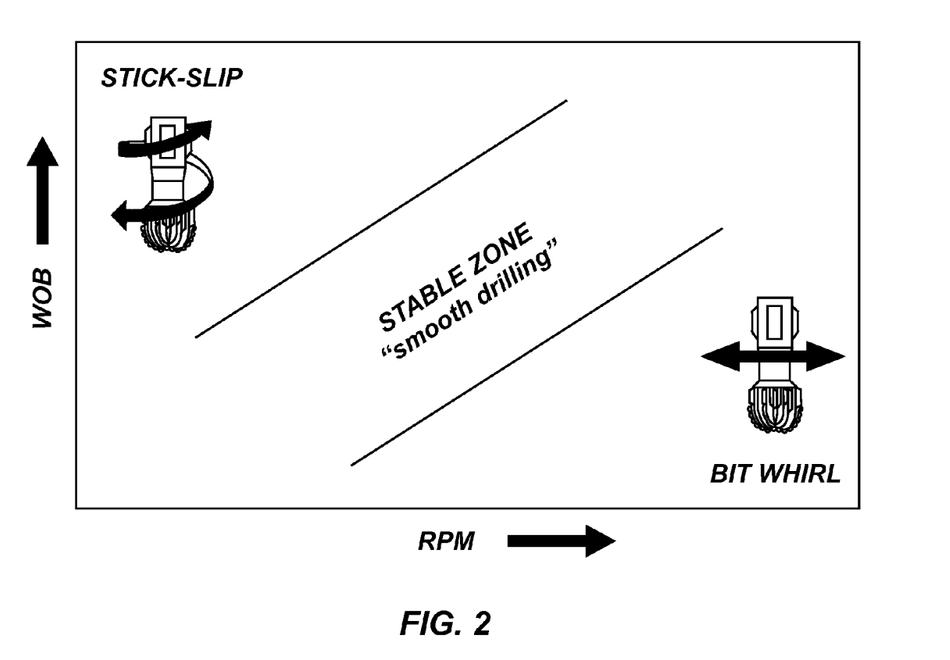
FIG. 2 is a graph representing relative weight-on-bit (WOB) and revolutions per minute (RPM) conditions that can result in stick-slip, bit whirl, or relatively stable or smooth drilling by a drill bit.

As shown in FIG. 2, low WOB and high RPM may result in bit whirl, while higher WOB and lower RPM may result in torsional instability that matures into stick-slip vibrations. Relatively stable drilling is often encountered between these two regimes.

In view of the above, mitigation of stick-slip vibrations is gaining a renewed interest in the art.

BRIEF SUMMARY

In some embodiments, the present disclosure includes methods of designing an earth-boring rotary drill bit. In accordance with such methods, an intended median depth-of-cut for the drill bit during drilling for at least one drilling interval is identified. A cutting element profile and a bit body of the drill bit are designed. An expected average rubbing area between the bit body and a subterranean formation to be drilled by the drill bit increases to a value over zero at a depth-of-cut that is about one hundred and fifty percent (150%) or less of the intended median depth-of-cut. The expected average rubbing area increases at an average rate of at least three square inches per inch per revolution of the drill bit (3.0 in.$^2$/(in./rev.)) as the depth-of-cut increases from the intended median depth-of-cut for the drill bit to about two hundred percent (200%) of the intended median depth-of-cut for the drill bit. Such methods also include generating a three-dimensional computer-aided design (CAD) of the earth-boring rotary drill bit.

In some embodiments, the present disclosure includes methods of fabricating an earth-boring rotary drill bit. In accordance with such methods, a bit body is formed comprising a plurality of blades and comprising cutting elements mounted to the bit body. The cutting elements and the bit body are configured such that an expected average rubbing area between the bit body and a subterranean formation to be drilled by the drill bit increases to a value over zero at a depth-of-cut that is about one hundred and fifty percent (150%) or less of an intended median depth-of-cut for the drill bit for at least one drilling interval, and such that the expected average rubbing area increases at an average rate of at least three square inches per inch per revolution of the drill bit (3.0 in.$^2$/(in./rev.)) as the depth-of-cut increases from the intended median depth-of-cut for the drill bit to about two hundred percent (200%) of the intended median depth-of-cut for the drill bit.

In some embodiments, the present disclosure includes earth-boring rotary drill bits that include a bit body including a plurality of blades and cutting elements mounted to the bit body. The cutting elements and the bit body are configured such that an expected average rubbing area between the bit body and a subterranean formation to be drilled by the drill bit over at least one drilling interval increases to a value over zero at a depth-of-cut that is about one hundred and fifty percent (150%) or less of an intended median depth-of-cut for the drill bit over the at least one drilling interval. The cutting elements and the bit body are also configured such that the expected average rubbing area increases at an average rate of at least three square inches per inch per revolution of the drill bit (3.0 in.$^2$/(in./rev.)) as the depth-of-cut increases from the intended median depth-of-cut for the drill bit to about two hundred percent (200%) of the intended median depth-of-cut for the drill bit.

DETAILED DESCRIPTION

The illustrations presented herein are not meant to be actual views of any particular drill bit or component thereof, but are merely idealized representations that are employed to describe certain embodiments of the present disclosure. For clarity in description, various features and elements common among the embodiments may be referenced with the same or similar reference numerals.

Figure 3:
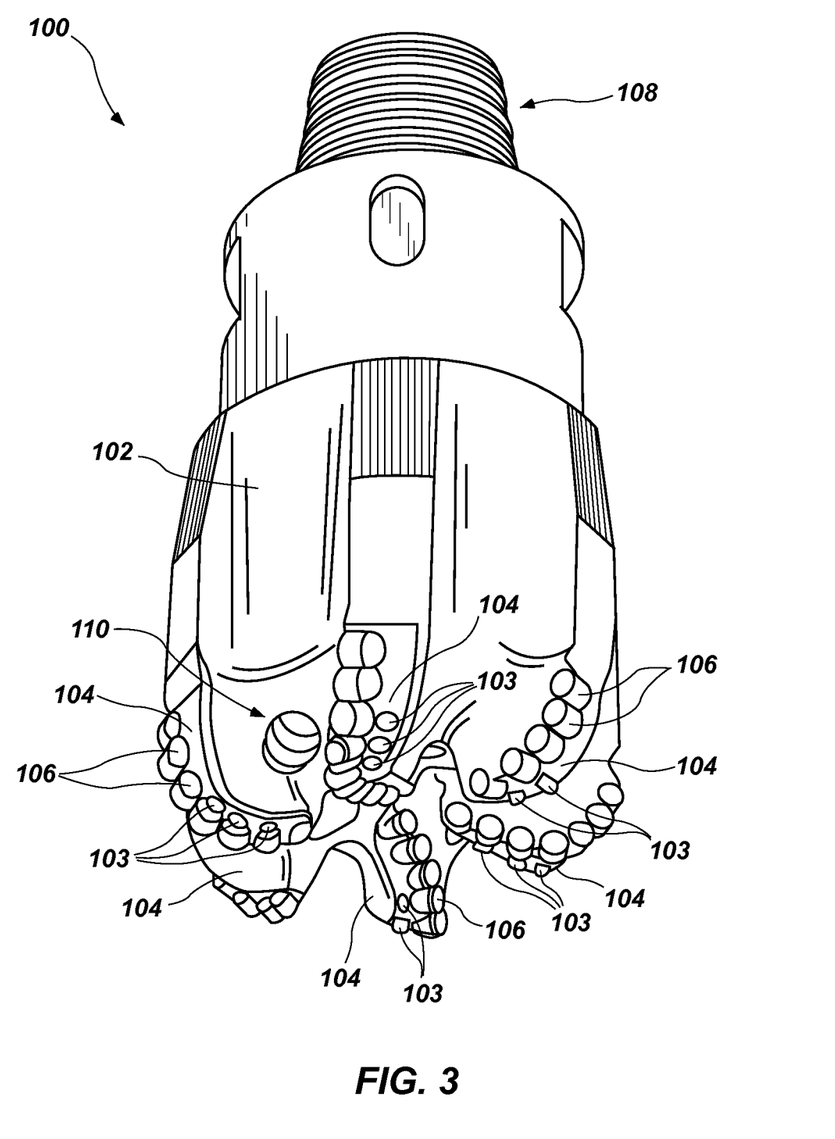
FIG. 3 illustrates an earth-boring rotary drill bit that may be designed and fabricated in accordance with embodiments of the present disclosure.

FIG. 3 illustrates an example of a fixed-cutter earth-boring rotary drill bit 100 that may be designed and fabricated in accordance with embodiments of the present disclosure. The drill bit 100 includes a bit body 102 having radially and longitudinally extending blades 104. In the embodiment of FIG. 3, the bit body 102 has six blades 104, although in other embodiments the bit body 102 may have more or fewer blades 104. Outer surfaces of the blades 104 may define at least a portion of what is referred to in the art as the "face" of the drill bit 100.

Cutting elements 106 may be mounted to the bit body 102 of the drill bit 100. For example, cutting element pockets may be formed in the blades 104, and the cutting elements 106 may be positioned in the cutting element pockets and bonded (e.g., brazed, welded, etc.) to the blades 104. The cutting elements 106 may comprise, for example, polycrystalline diamond compact (PDC) cutting elements each including a volume of polycrystalline diamond material. The volume of polycrystalline diamond material may be bonded to a cutting element substrate (e.g., a cobalt-cemented tungsten carbide substrate), as is known in the art. Such PDC cutting elements often have a generally cylindrical shape, and the volume of polycrystalline diamond material often comprises a generally planar layer (referred to in the art as a "table") formed on or bonded to a generally planar end surface of a generally cylindrical cobalt-cemented tungsten carbide substrate.

The drill bit 100 includes a connection portion 108, which may comprise, for example, a threaded pin conforming to specifications of the American Petroleum Institute (API) and configured for attachment to drill pipe of a drill string. In other embodiments, the drill bit 100 may comprise a casing bit configured to be attached to a section of wellbore casing or liner for drilling with the casing or liner.

The bit body 102 includes an inner plenum, access to which may be provided through the connection portion 108. Fluid passageways may extend from the inner plenum to fluid ports 110 at the face of the drill bit 100. During drilling, the drill bit 100 may be rotated at the bottom of the wellbore while drilling fluid is pumped through the bit body 102 and out of the fluid ports 110 (which may have fluid nozzles affixed therein). The drilling fluid carries formation cuttings generated by the cutting elements 106 away from the cutting elements 106 and up through the wellbore in the annulus between the drill string and the formation to the surface. The drilling fluid also may serve to cool the cutting elements 106 during drilling.

In some embodiments, the bit body 102 may include depth of cut control (DOCC) features 103 for limiting a depth-of-cut of the cutting elements 106 during drilling. Examples of such DOCC features 103 that may be employed in embodiments of the present disclosure are disclosed in, for example, U.S. Pat. No. 6,935,441, which issued Aug. 30, 2005 to Dykstra et al., U.S. Pat. No. 6,779,613, which issued Aug. 24, 2004 to Dykstra et al., U.S. Pat. No. 6,659,199, which issued Dec. 9, 2003 to Swadi, and U.S. Pat. No. 6,460,631, which issued Oct. 8, 2002 to Dykstra et al., the disclosure of each of which patents is incorporated herein in its entirety by this reference. The DOCC features 103 may comprise, for example, projections on outer surfaces of the blades 104 located rotationally behind cutting elements 106 mounted on those blades. The DOCC features 103 may be integrally formed with the blades 104, or they may comprise separately formed inserts that are bonded to the blades 104. For example, the DOCC features 103 may comprise one or more of rubbing blocks, round elements, cutter pocket backing structures, adaptive moving elements, etc.

The cutting elements 106 and the bit body 102 may be configured such that each cutting element 106 has a respective exposure relative to the bit body 102. The exposure of each cutting element 106 may be defined as the maximum distance to which the cutting element 106 may extend into the formation before the surfaces of the blade 104 to which the cutting element 106 is mounted begin to ride or rub on the formation, or, if the drill bit 100 includes DOCC features 103, the maximum distance to which the cutting element 106 may extend into the formation before the surfaces of the DOCC features 103 begin to ride or rub on the formation.

Figure 4:
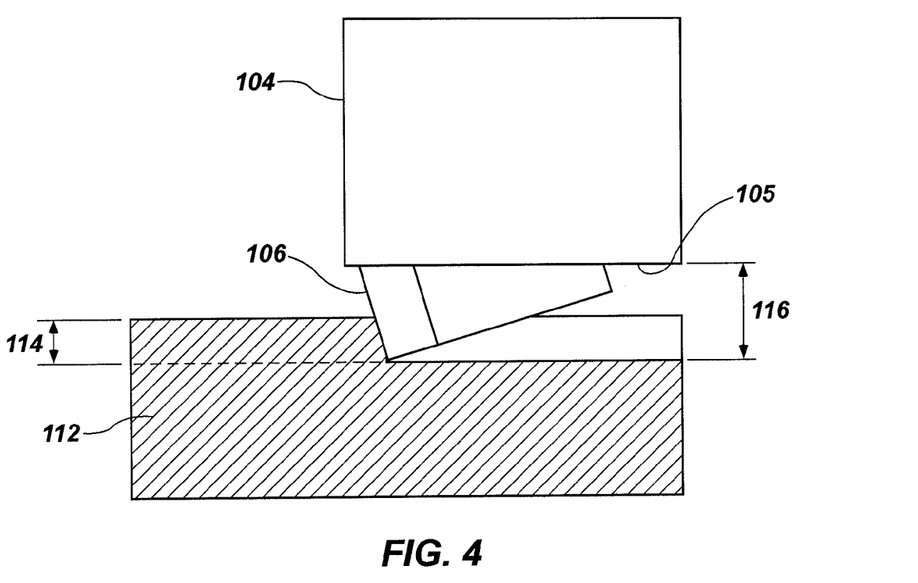
FIG. 4 is a simplified illustration of a cutting element of relatively higher exposure cutting a formation at an intended nominal or median depth-of-cut.
Figure 5:
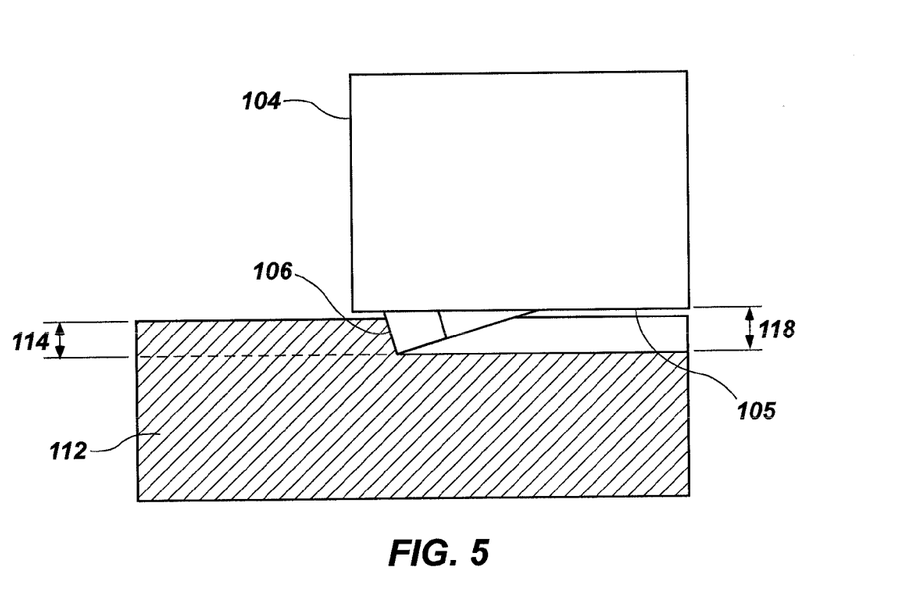
FIG. 5 is a simplified illustration of a cutting element of relatively lower exposure cutting a formation at the same intended nominal or median depth-of-cut illustrated in FIG. 4.

FIGS. 4 and 5 schematically illustrate cutting elements having different exposures. The cutting element 106 shown in FIG. 4 is attached to a blade 104 and is penetrating a subterranean formation 112 at a nominal depth-of-cut 114. The cutting element 106 has an exposure 116 by which the cutting element 106 is exposed beyond a surface 105 of the blade 104 to which it is attached. The exposure 116 may define a depth-of-cut at which the surface 105 of the blade 104 begins to rub against and penetrate into the formation. The cutting element 106 shown in FIG. 5 has a reduced exposure 118 relative to the exposure of the cutting element 106 of FIG. 4. The cutting element 106 of FIG. 5 is shown penetrating the formation 112 at the same nominal depth-of-cut 114 as that of the cutting element 106 shown in FIG. 4. As can be appreciated by comparing FIGS. 4 and 5, due to the fact that the cutting element 106 of FIG. 5 has a reduced exposure 118, the surface 105 of the blade 104 of FIG. 5 will begin to ride on and rub against the formation 112 at depths-of-cut that are relatively close to, but slightly greater than, the nominal depth-of-cut 114. In contrast, the blade 104 of FIG. 4 will begin to ride on and rub against the formation 112 at depths-of-cut that are relatively more distant from the nominal depth-of-cut 114 compared to the embodiment of FIG. 5.

In accordance with embodiments of the present disclosure, the bit body 102 and the cutting elements 106 (FIG. 3) may be configured such that one or more surfaces of the bit body 102 (e.g., radially outer surfaces 105 of the blades 104 and/or surfaces of DOCC features 103 carried on the blades 104) come into contact with the formation 112 (FIGS. 4 and 5) at depths-of-cut that are just above the expected nominal or median depth-of-cut for the drill bit 100 over at least one drilling interval in an effort to mitigate occurrence of the stick-slip phenomenon at the drill bit 100 during drilling.

For example, the bit body 102 and the cutting element profile of the cutting elements 106 may be designed and configured such that an expected average rubbing area between the bit body 102 (e.g., the surfaces 105 of the blades 104) and a subterranean formation 112 to be drilled by the drill bit 100 increases to a value over zero at a depth-of-cut that is about one hundred and fifty percent (150%) or less of the intended nominal or median depth-of-cut 114 for a drilling interval (e.g., through a specific formation type in which stick-slip is common, etc.). In some embodiments, the bit body 102 and the cutting element profile of the cutting elements 106 may be designed and configured such that the expected average rubbing area increases to a value over zero at a depth-of-cut that is about one hundred and thirty percent (130%) or less of the intended nominal or median depth-of-cut 114. More particularly, the bit body 102 and the cutting element profile of the cutting elements 106 may be designed and configured such that the expected average rubbing area increases to a value over zero at a depth-of-cut that is about one hundred and twenty percent (120%) or less of the intended nominal or median depth-of-cut 114 in some embodiments.

Additionally, in some embodiments, the bit body 102 and the cutting element profile of the cutting elements 106 may be designed and configured such that an expected average rubbing area between the bit body 102 and a subterranean formation 112 to be drilled by the drill bit 100 is at least substantially zero at depths-of-cut equal to and below the intended nominal or median depth-of-cut 114 for the drilling interval. In other embodiments, however, the bit body 102 and the cutting element profile of the cutting elements 106 may be designed and configured such that some degree of rubbing between the bit body 102 and the subterranean formation 112 is expected at depths-of-cut equal to and/or slightly below the intended nominal or median depth-of-cut 114.

Further, in accordance with embodiments of the present disclosure, the bit body 102 and the cutting elements 106 (FIG. 3) may be configured such that the contact or rubbing area between the bit body 102 and the formation 112 increases at a relatively rapid rate with increasing depth-of-cut in an effort to hinder very high depths-of-cut and to mitigate occurrence of the stick-slip phenomenon at the drill bit 100 during drilling.

Depth-of-cut, for purposes of describing embodiments of the present disclosure and operation of such embodiments, may be expressed in terms of fractions of an inch by which the drill bit 100 is advanced into the formation 112 per revolution of the drill bit 100.

Applicants designed and generated three-dimensional models for four different fixed-cutter drill bits generally similar to that shown in FIG. 3 using computer-aided drafting (CAD) software. Drilling with the four different drill bits was modeled using computer software, and the contact area between the bit body 102 and the formation 112 as a function of increasing depth-of-cut was calculated and graphed. The results are reflected in the graph of FIG. 6.

Figure 6:
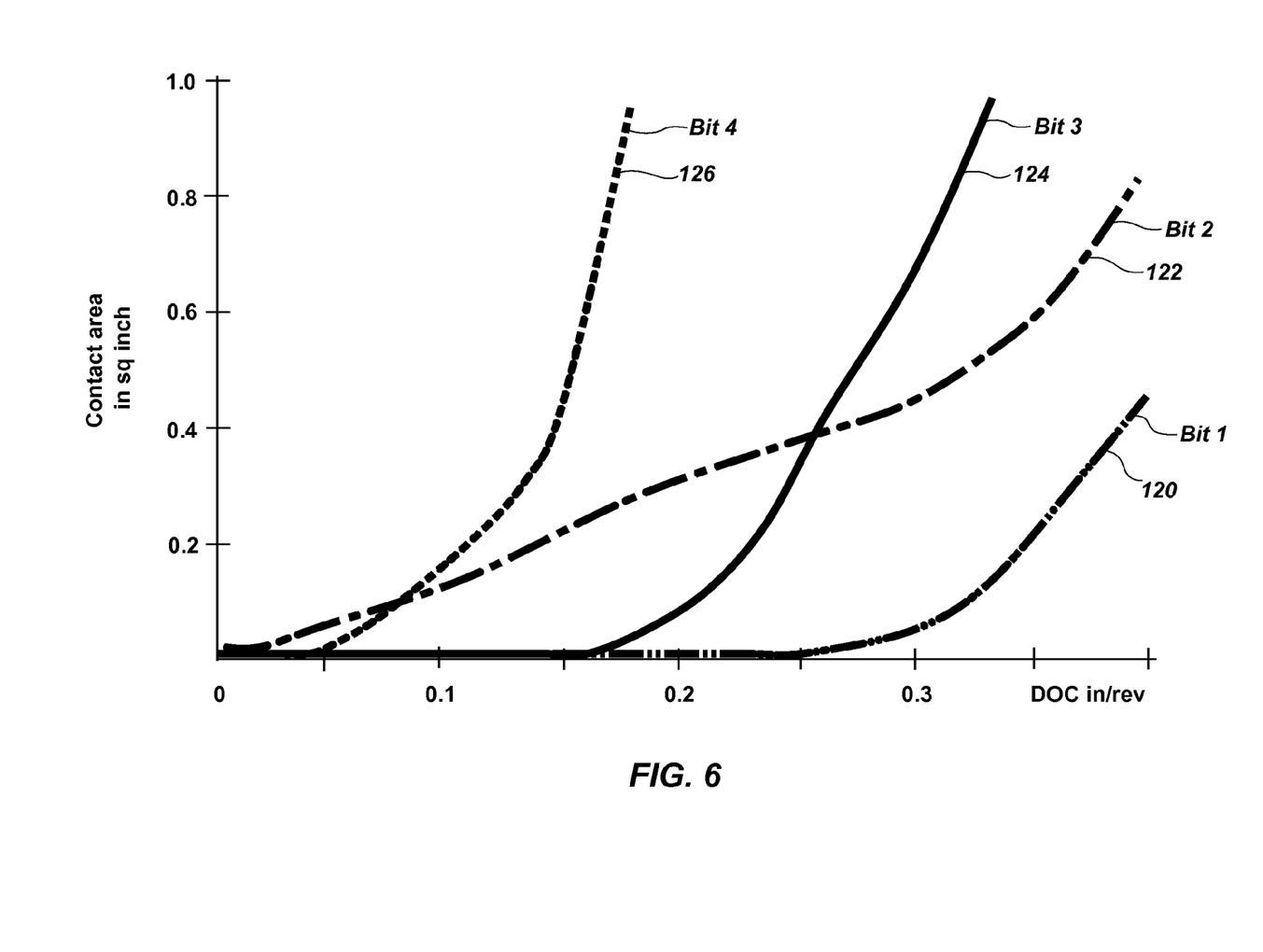
FIG. 6 is a graph illustrating a contact or "rubbing" area between a bit body of a drill bit and a formation as a function of depth-of-cut (DOC) for four different drill bits.

The line 120 shown in FIG. 6 corresponds to Bit 1. As can be deduced from the line 120, the bit body and cutting element profile for Bit 1 are designed and configured such that the cutting elements of Bit 1 have a relatively high exposure. As a result, rubbing between the bit body of Bit 1 and the formation does not occur until a relatively high depth-of-cut is reached. As shown in FIG. 6, the bit body of Bit 1 begins to rub against the formation at a depth of cut of about 0.25 in./rev. Additionally, the bit body and the cutting element profile of Bit 1 are designed and configured such that the expected average rubbing area increases from zero at a depth-of-cut of about 0.25 in./rev. to about 0.45 in.$^2$ at a depth-of-cut of about 0.40 in./rev. Thus, the average rate at which the rubbing area increases over this interval of depths-of-cut is approximately 3.0 in.$^2$/(in./rev.) (i.e., (0.45 in.$^2$–0.00 in.$^2$)/(0.4 in./rev.–0.25 in./rev.)).

The line 122 shown in FIG. 6 corresponds to Bit 2. As can be deduced from the line 122, the bit body and cutting element profile for Bit 2 are designed and configured such that the cutting elements of Bit 2 have a relatively low exposure. As a result, rubbing between the bit body of Bit 2 and the formation occurs at a relatively low depth-of-cut of about 0.025 in./rev. As also shown in FIG. 6, the bit body and the cutting element profile of Bit 2 are designed and configured such that the expected average rubbing area increases gradually and more linearly from zero at a depth-of-cut of about 0.025 in./rev. to about 0.85 in.$^2$ at a depth-of-cut of about 0.38 in./rev. Thus, the average rate at which the rubbing area increases over this interval of depths-of-cut is approximately 1.0 in.$^2$/(in./rev.) (i.e., (0.85 in.$^2$–0.00 in.$^2$)/(0.38 in./rev.–0.025 in./rev.)).

The line 124 shown in FIG. 6 corresponds to Bit 3. As can be deduced from the line 124, the bit body and cutting element profile for Bit 3 are designed and configured such that the cutting elements of Bit 3 have a medium exposure. As a result, rubbing between the bit body of Bit 3 and the formation occurs at a depth-of-cut of about 0.15 in./rev, which is between that of the high exposure Bit 1 and the low exposure Bit 2. As also shown in FIG. 6, the bit body and the cutting element profile of Bit 3 are designed and configured such that the expected average rubbing area increases at a relatively rapid rate from zero at a depth-of-cut of about 0.15 in./rev. to about 1.0 in.$^2$ at a depth-of-cut of about 0.32 in./rev. Thus, the average rate at which the rubbing area increases over this interval of depths-of-cut is approximately 5.9 in.$^2$/(in./rev.) (i.e., (1.0 in.$^2$–0.00 in.$^2$)/(0.32 in./rev.–0.15 in./rev.)).

The line 126 shown in FIG. 6 corresponds to Bit 4. As can be deduced from the line 126, the bit body and cutting element profile for Bit 4 are designed and configured such that the cutting elements of Bit 4 have a relatively low exposure. As a result, rubbing between the bit body of Bit 4 and the formation occurs at a relatively low depth-of-cut of about 0.05 in./rev. As also shown in FIG. 6, the bit body and the cutting element profile of Bit 4 are designed and configured such that the expected average rubbing area increases at a relatively rapid rate from zero at a depth-of-cut of about 0.05 in./rev. to about 1.0 in.$^2$ at a depth-of-cut of about 0.15 in./rev. Thus, the average rate at which the rubbing area increases over this interval of depths-of-cut is approximately 10.0 in.$^2$/(in./rev.) (i.e., (1.0 in.$^2$–0.00 in.$^2$)/(0.15 in./rev.–0.05 in./rev.)).

In accordance with embodiments of the present disclosure, the bit body 102 and the cutting element profile for the cutting elements 106 of a drill bit 100 may be designed and configured such that an expected average rubbing area between the bit body 102 and a subterranean formation 112 to be drilled by the drill bit 100 increases at an average rate of at least three square inches per inch per revolution of the drill bit (3.0 in.$^2$/(in./rev.)) as the depth-of-cut increases from the intended nominal or median depth-of-cut 114 (FIGS. 4 and 5) for the drill bit 100 to about two hundred percent (200%) of the intended nominal or median depth-of-cut 114 for the drill bit 100. More particularly, the bit body 102 and the cutting element profile for the cutting elements 106 of a drill bit 100 may be designed and configured such that an expected average rubbing area between the bit body 102 and a subterranean formation 112 to be drilled by the drill bit 100 increases at an average rate of at least four and one-half square inches per inch per revolution of the drill bit (4.5 in.$^2$/(in./rev.)) as the depth-of-cut increases from the intended nominal or median depth-of-cut 114 for the drill bit to about two hundred percent (200%) of the intended nominal or median depth-of-cut 114 for the drill bit 100. Even more particularly, the bit body 102 and the cutting element profile for the cutting elements 106 of a drill bit 100 may be designed and configured such that an expected average rubbing area between the bit body 102 and a subterranean formation 112 to be drilled by the drill bit 100 increases at an average rate of at least six square inches per inch per revolution of the drill bit (6.0 in.$^2$/(in./rev.)) as the depth-of-cut increases from the intended nominal or median depth-of-cut 114 for the drill bit to about two hundred percent (200%) of the intended nominal or median depth-of-cut 114 for the drill bit 100.

In some embodiments, the rates of increase of average rubbing area described herein may be suitable for bits having an outer diameter of about 8.75 inches. However, the rates described in the present disclosure are not limited to use with bits of about 8.75 inches. Rather, the rates described in the present disclosure may be suitable for bits of larger or smaller outer diameters than about 8.75 inches. In some embodiments, a relatively larger rate of increase of average rubbing area may be used with larger bit sizes, while a relatively smaller rate of increase of average rubbing area may be used for smaller bit sizes. One of ordinary skill in the art will be able to scale the rates listed herein for use with other bit sizes.

Actual physical drill bits corresponding to the three-dimensional models (generated using computer-aided drafting (CAD) software) corresponding to Bits 1 through 4 were fabricated. An in-bit vibration sensor was installed in the shank of each drill bit for detecting and measuring vibrations at the drill bits during drilling. The vibrations sensors include accelerometers from which the axial, lateral, and torsional vibrations and bit angular velocity are computed. Five-second-long samples of high frequency data are stored at regular intervals during drilling. The sensors also calculate and store average values including axial and lateral accelerations, and maximum, minimum, and average rotary speeds. The stick-slip is identified from the measured and recorded drill bit rotary speed.

Figure 7A:
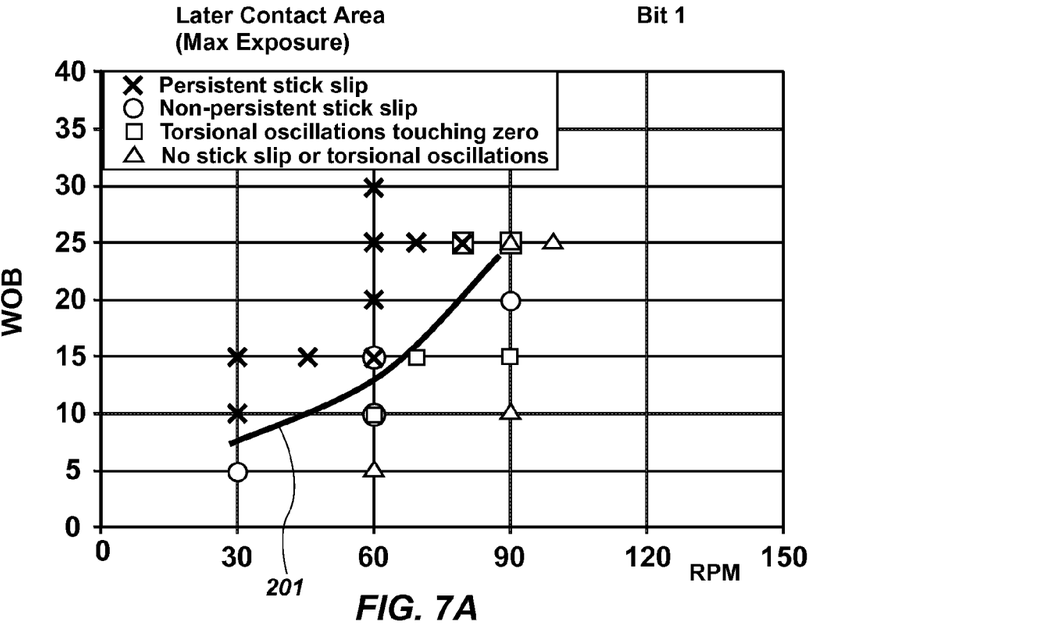
FIGS. 7A-7D are graphs illustrating levels of stick-slip for each of the four drill bits represented in FIG. 6 at different weight-on-bit (WOB) and revolutions per minute (RPM) drilling parameters.
Figure 7B:
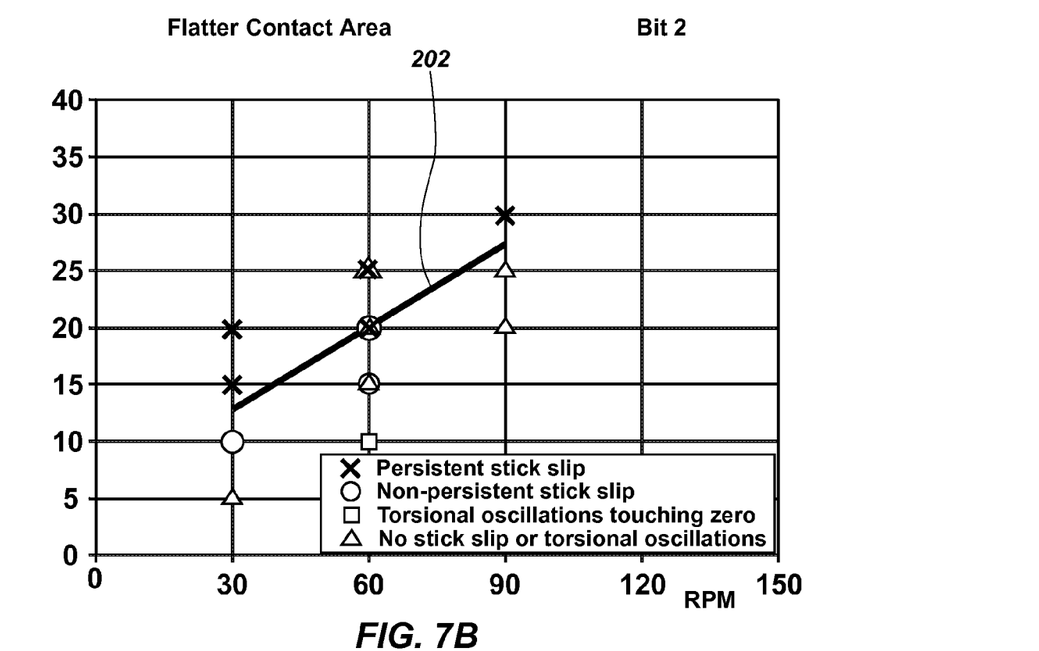

Each of Bits 1 through 4, equipped with an in-bit vibration sensor, was used to drill a wellbore on a full-scale research drill rig in Oklahoma, U.S.A. About fifty feet (50 ft) of rock was drilled with each bit to generate vibration measurements and detect stick-slip at different operating parameters. The wellbores were drilled vertically with good borehole quality to minimize the influence of the bottom-hole-assembly (BHA) and drill pipe on stick-slip. The same BHA and drill pipe was used in each well. Since the wells were shallow with a total depth of about 3,000 ft., 3½ in. drill pipe was employed to reduce the torsional stiffness and rotary inertia of the drill string and exacerbate stick-slip. The BHA was equipped with commercially available measurement-while-drilling (MWD) equipment. The BHA was stabilized to avoid excessive lateral vibrations. The data collected during the drilling of the wellbores using Bits 1 through 4 is represented graphically in the stability maps in WOB-RPM space shown in FIGS. 7A through 7D, respectively. In particular, the data collected from Bit 1 is represented in FIG. 7A, the data collected from Bit 2 is represented in FIG. 7B, the data collected from Bit 3 is represented in FIG. 7C, and the data collected from Bit 4 is represented in FIG. 7D.

During drilling using each of Bits 1 through 4, the operating parameters were varied to determine the stick-slip zone boundary. Each "data point" on the maps of FIGS. 1 through 4 corresponds to drilling at a specified WOB and RPM for a few minutes to reach a steady state and to allow the in-bit sensors to acquire data. Data points marked with an "X" on the maps represent persistent stick-slip. Data points marked with a circle on the maps represent non-persistent stick-slip. Data points marked with a square on the maps represent torsional oscillations (which correspond to stick-slip) touching zero. Data points marked with a triangle on the maps represent no stick-slip or torsional oscillations. For each data point where stick-slip was observed during drilling, the drilling was restarted before advancing to the next data point so that all data points have a similar initial condition.

Figure 7C:
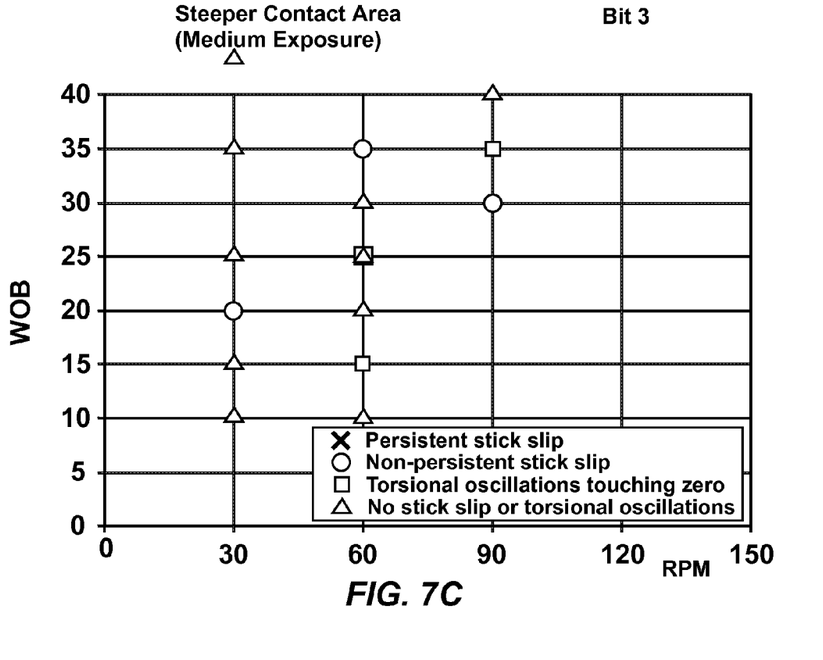
Figure 7D:
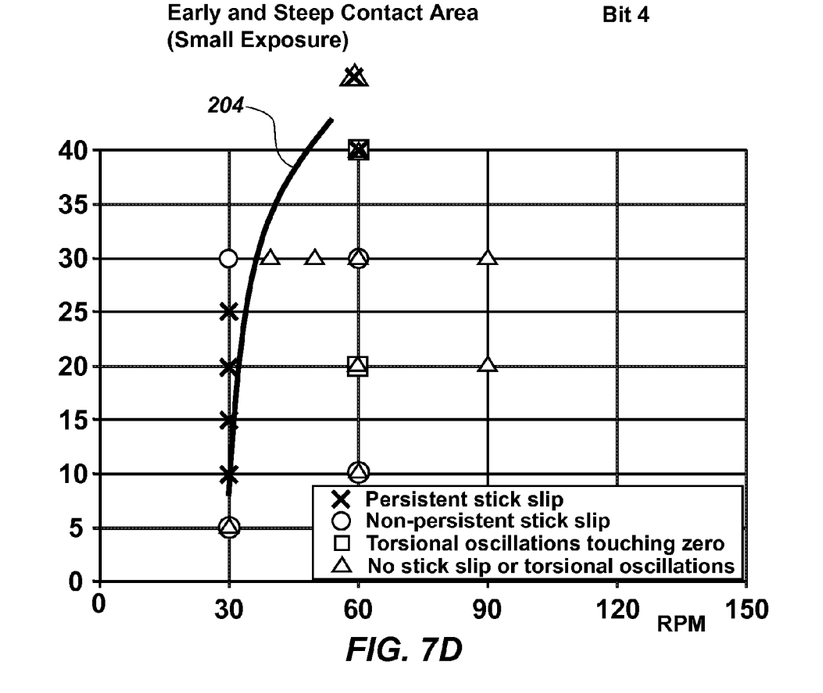

As shown in FIG. 7C, Bit 3 did not exhibit any persistent stick-slip. Additionally, as can be seen by comparing FIG. 7D with FIGS. 7A and 7B, a stick-slip boundary 204 for Bit 4 is shifted to lower RPMs and higher WOBs compared to stick-slip boundaries 201 and 202 of Bits 1 and 2, respectively. Thus, Bit 4 was less prone to undergo stick-slip compared to Bits 1 and 2 across a range of RPMs and WOBs.

Figure 8:
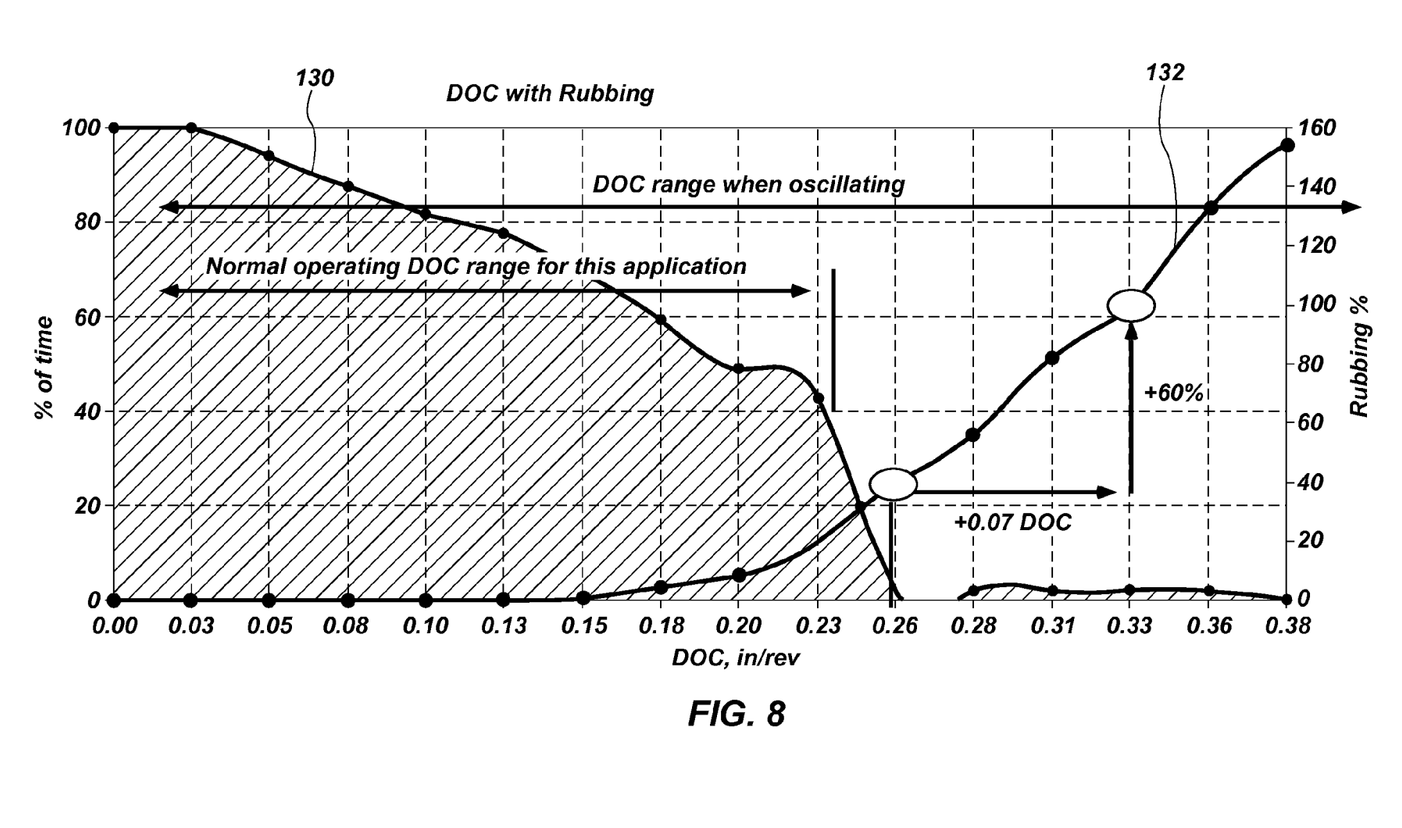
FIG. 8 is a graph for a drill bit that illustrates both a percentage of time at which the drill bit is drilling at specific depths-of-cut over a range of depths-of-cut, as well as an amount of rubbing area between a bit body of the drill bit as a function of depth-of-cut over the same range of depths-of-cut.

FIG. 8 is a graph of data collected for a drill bit that illustrates, as a function of depth-of-cut, both a percentage of time at which the drill bit was drilling a formation at or above specific depths-of-cut, as well as an amount of rubbing area between a bit body of the drill bit and the formation. In particular, the x-axis along the bottom of the graph of FIG. 8 is the depth-of-cut. The y-axis along the left side of the graph is percent of drilling time, and the y-axis on the right side of the graph is the percent of rubbing area, where 100% corresponds to 1.0 in.$^2$ of rubbing area.

The points along the curve 130 in FIG. 8 represent the percentage of drilling time at which drilling was carried out at or above the corresponding depth-of-cut. For example, drilling was carried out at a depth-of-cut of 0.03 in./rev. or higher about 100% of the time, drilling was carried out at a depthof-cut of 0.15 in./rev. or higher about 75% of the time, drilling was carried out at a depth-of-cut of 0.20 in./rev. or higher about 50% of the time, etc. Thus, the median or nominal depth-of-cut for the drill bit was about 0.20 in./rev. over the drilling interval, since drilling was carried out at or above this depth-of-cut about 50% of the time.

The points along the curve 132 in FIG. 8 represent the percentage of rubbing area between the bit body of the drill bit and the formation at the respective depths-of-cut. As shown in FIG. 8, rubbing between the bit body and the formation begins to occur at a depth-of-cut that is about 0.15 in./rev., increases to about 5% (i.e., 0.05 in.$^2$) at about 0.20 in./rev. (the median or nominal depth-of-cut), and increases to about 100% (i.e., 1.0 in.$^2$) at a depth-of-cut of about 0.33 in./rev. Extrapolating values beyond those shown in the graph of FIG. 8, at a depth-of-cut that is 200% of the median depth-of-cut (0.20 in./rev.), which is about 0.40 in./rev., the average rubbing area is about 160%, or 1.60 in.$^2$. Thus, the average rubbing area increases at a rate of about 7.75 in.$^2$/(in./rev.) as the depth-of-cut increases from the median depth-of-cut for the drill bit, which is 0.20 in./rev., to about 0.40 in./rev., which is two hundred percent (200%) of the median depth-of-cut (i.e., (1.60 in.$^2$−0.05 in.$^2$)/(0.40 in./rev.−0.20 in./rev.)).

Embodiments of the present disclosure may be used to design and fabricate drill bits that are less prone to stick-slip.

Additional non-limiting example embodiments of the disclosure are set forth below.

Embodiment 1: A method of designing an earth-boring rotary drill bit, comprising: selecting a number of blades for a bit body of the drill bit; selecting cutting elements to be mounted to the bit body of the drill bit along a cutting element profile; identifying an intended median depth-of-cut for the drill bit during drilling; designing the cutting element profile and the bit body such that an expected average rubbing area between the bit body and a subterranean formation to be drilled by the drill bit increases to a value over zero at a depth-of-cut that is about one hundred and fifty percent (150%) or less of the intended median depth-of-cut, and such that the expected average rubbing area increases with increasing depth-of-cut at an average rate of at least three square inches per inch per revolution of the drill bit (3.0 in.$^2$/(in./rev)) as the depth-of-cut increases from the intended median depth-of-cut for the drill bit to about two hundred percent (200%) of the intended median depth-of-cut for the drill bit; and generating a three-dimensional computer-aided design (CAD) of the earth-boring rotary drill bit.

Embodiment 2: The method of Embodiment 1, further comprising designing the cutting element profile and the bit body such that an expected average rubbing area between the bit body and a subterranean formation to be drilled by the drill bit is at least substantially zero at depths-of-cut equal to and below the intended median depth-of-cut.

Embodiment 3: The method of Embodiment 1 or Embodiment 2, further comprising designing the cutting element profile and the bit body such that the expected average rubbing area increases to a value over zero at a depth-of-cut that is about one hundred and thirty percent (130%) or less of the intended median depth-of-cut.

Embodiment 4: The method of any one of Embodiments 1 through 3, further comprising designing the cutting element profile and the bit body such that the expected average rubbing area increases to a value over zero at a depth-of-cut that is about one hundred and twenty percent (120%) or less of the intended median depth-of-cut.

Embodiment 5: The method of any one of Embodiments 1 through 4, further comprising designing the cutting element profile and the bit body such that the expected average rubbing area between the bit body and a subterranean formation to be drilled by the drill bit increases with increasing depth-of-cut at an average rate of at least four and one-half square inches per inch per revolution of the drill bit (4.5 in.$^2$/(in./rev.)) as the depth-of-cut increases from the intended median depth-of-cut for the drill bit to about two hundred percent (200%) of the intended median depth-of-cut for the drill bit.

Embodiment 6: The method of any one of Embodiments 1 through 5, further comprising designing the cutting element profile and the bit body such that the expected average rubbing area between the bit body and a subterranean formation to be drilled by the drill bit increases with increasing depth-of-cut at an average rate of at least six square inches per inch per revolution of the drill bit (6.0 in.$^2$/(in./rev.)) as the depth-of-cut increases from the intended median depth-of-cut for the drill bit to about two hundred percent of the intended median depth-of-cut for the drill bit.

Embodiment 7: The method of any one of Embodiments 1 through 6, further comprising designing the bit body such that the expected average rubbing area between the bit body and a subterranean formation to be drilled by the drill bit extends over one or more of surfaces of the blades of the bit body and surfaces of depth-of-cut control features of the bit body.

Embodiment 8: A method of fabricating an earth-boring rotary drill bit, comprising: forming a bit body comprising a plurality of blades and comprising cutting elements mounted to the bit body; and configuring the cutting elements and the bit body such that an expected average rubbing area between the bit body and a subterranean formation to be drilled by the drill bit increases to a value over zero at a depth-of-cut that is about one hundred and fifty percent (150%) or less of an intended median depth-of-cut for the drill bit, and such that the expected average rubbing area increases with increasing depth-of-cut at an average rate of at least three square inches per inch per revolution of the drill bit (3.0 in.$^2$/(in./rev.)) as the depth-of-cut increases from the intended median depth-of-cut for the drill bit to about two hundred percent (200%) of the intended median depth-of-cut for the drill bit.

Embodiment 9: The method of Embodiment 8, further comprising configuring the cutting elements and the bit body such that an expected average rubbing area between the bit body and a subterranean formation to be drilled by the drill bit is at least substantially zero at depths-of-cut equal to and below the intended median depth-of-cut.

Embodiment 10: The method of Embodiment 8 or Embodiment 9, further comprising configuring the cutting elements and the bit body such that the expected average rubbing area increases to a value over zero at a depth-of-cut that is about one hundred and thirty percent (130%) or less of the intended median depth-of-cut.

Embodiment 11: The method of any one of Embodiments 8 through 10, further comprising configuring the cutting elements and the bit body such that the expected average rubbing area increases to a value over zero at a depth-of-cut that is about one hundred and twenty percent (120%) or less of the intended median depth-of-cut.

Embodiment 12: The method of any one of Embodiments 8 through 11, further comprising configuring the cutting elements and the bit body such that the expected average rubbing area increases with increasing depth-of-cut at an average rate of at least four and one-half square inches per inch per revolution of the drill bit (4.5 in.$^2$/(in./rev.)) as the depth-of-cut increases from the intended median depth-of-cut for the drill bit to about two hundred percent (200%) of the intended median depth-of-cut for the drill bit.

Embodiment 13: The method of any one of Embodiments 8 through 12, further comprising configuring the cutting elements and the bit body such that the expected average rubbing area increases with increasing depth-of-cut at an average rate of at least six square inches per inch per revolution of the drill bit (6.0 in.$^2$/(in./rev.)) as the depth-of-cut increases from the intended median depth-of-cut for the drill bit to about two hundred percent (200%) of the intended median depth-of-cut for the drill bit.

Embodiment 14: The method of any one of Embodiments 8 through 13, further comprising configuring the bit body such that the expected average rubbing area between the bit body and a subterranean formation to be drilled by the drill bit extends over one or more of surfaces of the plurality of blades of the bit body and surfaces of depth-of-cut control features of the bit body.

Embodiment 15: An earth-boring rotary drill bit, comprising: a bit body including a plurality of blades; and cutting elements mounted to the bit body; wherein the cutting elements and the bit body are configured such that an expected average rubbing area between the bit body and a subterranean formation to be drilled by the drill bit increases to a value over zero at a depth-of-cut that is about one hundred and fifty percent (150%) or less of an intended median depth-of-cut for the drill bit, and such that the expected average rubbing area increases with increasing depth-of-cut at an average rate of at least three square inches per inch per revolution of the drill bit (3.0 in.$^2$/(in./rev.)) as the depth-of-cut increases from the intended median depth-of-cut for the drill bit to about two hundred percent (200%) of the intended median depth-of-cut for the drill bit.

Embodiment 16: The earth-boring rotary drill bit of Embodiment 15, wherein the cutting elements and the bit body are configured such that an expected average rubbing area between the bit body and a subterranean formation to be drilled by the drill bit is at least substantially zero at depths-of-cut equal to and below the intended median depth-of-cut.

Embodiment 17: The earth-boring rotary drill bit of Embodiment 15 or Embodiment 16, wherein the cutting elements and the bit body are configured such that the expected average rubbing area increases to a value over zero at a depth-of-cut that is about one hundred and thirty percent (130%) or less of the intended median depth-of-cut.

Embodiment 18: The earth-boring rotary drill bit of any one of Embodiments 15 through 17, wherein the cutting elements and the bit body are configured such that the expected average rubbing area increases to a value over zero at a depth-of-cut that is about one hundred and twenty percent (120%) or less of the intended median depth-of-cut.

Embodiment 19: The earth-boring rotary drill bit of any one of Embodiments 15 through 18, wherein the cutting elements and the bit body are configured such that the expected average rubbing area increases with increasing depth-of-cut at an average rate of at least four and one-half square inches per inch per revolution of the drill bit (4.5 in.$^2$/(in./rev.)) as the depth-of-cut increases from the intended median depth-of-cut for the drill bit to about two hundred percent (200%) of the intended median depth-of-cut for the drill bit.

Embodiment 20: The earth-boring rotary drill bit of any one of Embodiments 15 through 19, wherein the cutting elements and the bit body are configured such that the expected average rubbing area increases with increasing depth-of-cut at an average rate of at least six square inches per inch per revolution of the drill bit (6.0 in.$^2$/(in./rev.)) as the depth-of-cut increases from the intended median depth-of-cut for the drill bit to about two hundred percent (200%) of the intended median depth-of-cut for the drill bit.

Embodiment 21: The earth-boring rotary drill bit of any one of Embodiments 15 through 20, wherein the bit body further includes depth-of-cut control features.

Embodiment 22: The earth-boring rotary drill bit of Embodiment 21, wherein the bit body is configured such that the expected average rubbing area between the bit body and a subterranean formation to be drilled by the drill bit extends over one or more of surfaces of the depth-of-cut control features.

Embodiment 23: The earth-boring rotary drill bit of any one of Embodiments 15 through 22, wherein the bit body is configured such that the expected average rubbing area between the bit body and a subterranean formation to be drilled by the drill bit extends over one or more of surfaces of the plurality of blades of the bit body.

Embodiment 24: The method of any one of Embodiments 8 through 14, further comprising generating a three-dimensional computer-aided design (CAD) of the earth-boring rotary drill bit, wherein configuring the cutting elements and the bit body comprises configuring the cutting elements and the bit body based on the three-dimensional computer-aided design (CAD) of the earth-boring rotary drill bit.

Embodiment 25: A method of designing an earth-boring rotary drill bit, comprising: identifying an intended median depth-of-cut for the drill bit during drilling; designing a cutting element profile and a bit body such that an expected average rubbing area between the bit body and a subterranean formation to be drilled by the drill bit increases to a value over zero at a depth-of-cut that is about one hundred and fifty percent (150%) or less of the intended median depth-of-cut, and such that the expected average rubbing area increases with increasing depth-of-cut at an average rate of at least three square inches per inch per revolution of the drill bit (3.0 in.$^2$/(in./rev.)) as the depth-of-cut increases from the intended median depth-of-cut for the drill bit to about two hundred percent (200%) of the intended median depth-of-cut for the drill bit; and generating a three-dimensional computer-aided design (CAD) of the earth-boring rotary drill bit Embodiment 26: The method of Embodiment 25, further comprising: selecting a number of blades for the bit body of the drill bit; and selecting cutting elements to be mounted to the bit body of the drill bit along a cutting element profile.

While the present invention has been described herein with respect to certain embodiments, those of ordinary skill in the art will recognize and appreciate that it is not so limited. Rather, many additions, deletions, and modifications to the embodiments depicted and described herein may be made without departing from the scope of the invention as hereinafter claimed, and legal equivalents. In addition, features from one embodiment may be combined with features of another embodiment while still being encompassed within the scope of the invention as contemplated by the inventor. Further, the invention has utility in drill bits having different bit profiles as well as different cutter types.

What is claimed is:

1. An earth-boring rotary drill bit, comprising:
a bit body including a plurality of blades; and
cutting elements mounted to the blades of the bit body;
wherein the cutting elements and the blades of the bit body are configured such that an expected average rubbing area between a surface of the blades of the bit body and a subterranean formation to be drilled by the drill bit over at least one drilling interval increases to a value over zero at a depth-of-cut that is about one hundred and fifty percent (150%) or less of an intended median depth-of-cut for the drill bit over the at least one drilling interval, and such that the expected average rubbing area increases with increasing depth-of-cut at an average rate of at least three square inches per inch per revolution of the drill bit (3.0 in.$^2$/(in./rev.)) as the depth-of-cut increases from the intended median depth-of-cut for the drill bit to about two hundred percent (200%) of the intended median depth-of-cut for the drill bit.

2. The earth-boring rotary drill bit of claim 1, wherein the cutting elements and the blades of the bit body are configured such that an expected average rubbing area between the surface of the blades of the bit body and a subterranean formation to be drilled by the drill bit is at least substantially zero at depths-of-cut equal to and below the intended median depth-of-cut.

3. The earth-boring rotary drill bit of claim 1, wherein the cutting elements and the blades of the bit body are configured such that the expected average rubbing area increases to a value over zero at a depth-of-cut that is about one hundred and thirty percent (130%) or less of the intended median depth-of-cut.

4. The earth-boring rotary drill bit of claim 1, wherein the cutting elements and the blades of the bit body are configured such that the expected average rubbing area increases to a value over zero at a depth-of-cut that is about one hundred and twenty percent (120%) or less of the intended median depth-of-cut.

5. The earth-boring rotary drill bit of claim 1, wherein the cutting elements and the blades of the bit body are configured such that the expected average rubbing area increases with increasing depth-of-cut at an average rate of at least four and one-half square inches per inch per revolution of the drill bit (4.5 in.$^2$/(in./rev.)) as the depth-of-cut increases from the intended median depth-of-cut for the drill bit to about two hundred percent (200%) of the intended median depth-of-cut for the drill bit.

6. The earth-boring rotary drill bit of claim 1, wherein the bit body further includes depth-of-cut control features.

7. The earth-boring rotary drill bit of claim 6, wherein the bit body is configured such that the expected average rubbing area between the surface of the blades of the bit body and a subterranean formation to be drilled by the drill bit further comprises a rubbing area of one or more of surfaces of the depth-of-cut control features.

8. The earth-boring rotary drill bit of claim 1, wherein the bit body is configured such that the expected average rubbing area between the surface of the blades of the bit body and a subterranean formation to be drilled by the drill bit extends over one or more surfaces of the plurality of blades of the bit body.

* * * * *

UNITED STATES PATENT AND TRADEMARK OFFICE
CERTIFICATE OF CORRECTION

PATENT NO. : 9,097,065 B2  
APPLICATION NO. : 13/630780  
DATED : August 4, 2015  
INVENTOR(S) : Thorsten Schwefe et al.

Page 1 of 1

It is certified that error appears in the above-identified patent and that said Letters Patent is hereby corrected as shown below:

On the title page:
ITEM (72) Inventors: change "Thorsten Schwefe, Spring, TX (US);"
to --Thorsten Schwefe, Virginia Water, Surrey (GB);--

Signed and Sealed this  
Fifth Day of January, 2016

Michelle K. Lee  
*Director of the United States Patent and Trademark Office*